United States Patent  
Han

(10) Patent No.: US 10,020,468 B2  
(45) Date of Patent: Jul. 10, 2018

(54) ORGANIC ELECTROLUMINESCENCE DISPLAY DEVICE

(71) Applicant: SAMSUNG DISPLAY CO., LTD., Yongin-si, Gyeonggi-do (KR)

(72) Inventor: Myungsuk Han, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/682,942

(22) Filed: Aug. 22, 2017

(65) Prior Publication Data

US 2018/0090719 A1 Mar. 29, 2018

(30) Foreign Application Priority Data

Sep. 27, 2016 (KR) .................. 10-2016-0124271

(51) Int. Cl.
*H01L 51/52* (2006.01)
*H01L 27/32* (2006.01)
*H01L 51/50* (2006.01)

(52) U.S. Cl.
CPC ...... *H01L 51/5278* (2013.01); *H01L 27/3244* (2013.01); *H01L 51/5004* (2013.01); *H01L 51/5016* (2013.01); *H01L 51/5206* (2013.01); *H01L 51/5221* (2013.01); *H01L 2251/5384* (2013.01); *H01L 2251/552* (2013.01); *H01L 2251/558* (2013.01)

(58) Field of Classification Search
CPC ............. H01L 51/5278; H01L 27/3244; H01L 51/5004; H01L 51/5016; H01L 51/5206; H01L 51/5221
See application file for complete search history.

(56) References Cited

U.S. PATENT DOCUMENTS 5,844,363 A * 12/1998 Gu ..................... H01L 51/5012
313/506
2002/0113546 A1* 8/2002 Seo ..................... H01L 51/5012
313/504

(Continued)

FOREIGN PATENT DOCUMENTS

KR 10-2011-0089128 A 8/2011
KR 10-2012-0077301 A 7/2012

(Continued)

*Primary Examiner* — Walter H Swanson
(74) *Attorney, Agent, or Firm* — Lee & Morse P.C.

(57) ABSTRACT

An organic electroluminescence display device includes a first electrode, a second electrode on the first electrode, and a light-emitting unit between the first electrode and the second electrode, the light-emitting unit including a first sub-light-emitting unit on the first electrode and including a first emission layer, a first charge generation layer on the first sub-light-emitting unit, a second sub-light-emitting unit on the first charge generation layer and including a second emission layer, a second charge generation layer on the second sub-light-emitting unit, and a third sub-light-emitting unit on the second charge generation layer and including a third emission layer, wherein each of the first emission layer and the second emission layer includes a first host, the third emission layer includes a second host different from the first host, and a thickness of the second emission layer is 1.0 nm or less.

10 Claims, 6 Drawing Sheets

(56) References Cited

U.S. PATENT DOCUMENTS

| | | | |
|---|---|---|---|
| 2007/0164278 A1* | 7/2007 | Lee | H01L 51/5036 257/40 |
| 2008/0067928 A1 | 3/2008 | Fukuoka et al. | |
| 2011/0248249 A1* | 10/2011 | Forrest | H01L 51/5016 257/40 |
| 2014/0167014 A1 | 6/2014 | Liping et al. | |

FOREIGN PATENT DOCUMENTS

| | | |
|---|---|---|
| KR | 10-2015-0015647 A | 2/2015 |
| KR | 10-2015-0025417 A | 3/2015 |

\* cited by examiner

ORGANIC ELECTROLUMINESCENCE DISPLAY DEVICE

CROSS-REFERENCE TO RELATED APPLICATIONS

Korean Patent Application No. 10-2016-0124271, filed on Sep. 27, 2016, in the Korean Intellectual Property Office, and entitled: "Organic Electroluminescence Display Device," is incorporated by reference herein in its entirety.

BACKGROUND

1. Field

The present disclosure herein relates to organic electroluminescence display devices, and more particularly, to organic electroluminescence display devices which may achieve excellent efficiency while reducing material costs.

2. Description of the Related Art

Flat display devices may be broadly classified as emissive types and non-emissive types. The emissive types may include a flat cathode ray tube display, a plasma display panel, and an organic electroluminescence display device.

The organic electroluminescence display device is a self-emissive display, in which it may have wide viewing angles, excellent contrast, and high response speed. Accordingly, the organic electroluminescence display device is on the spot light because it may be used in displays for a mobile device, e.g., digital cameras, video cameras, camcorders, portable information terminals, smart phones, ultra-slim notebooks, tablet personal computers, and flexible displays, or in large electronic products or large electrical products, e.g., ultra-thin televisions.

The organic electroluminescence display device may generate light using a principle, in which holes and electrons respectively injected from a first electrode and a second electrode are recombined in an emission layer to emit light, wherein light is emitted when excitons formed by the recombination of the injected electrons and holes drop from an excited state to a ground state. The organic electroluminescence display device has been developed in various structures, and, among them, a tandem-type structure has emerged in which each layer between the first electrode and the second electrode is deposited without a mask.

SUMMARY

An embodiment of the present disclosure provides an organic electroluminescence display device including a first electrode, a second electrode disposed on the first electrode, and a light-emitting unit disposed between the first electrode and the second electrode, wherein the light-emitting unit includes a first sub-light-emitting unit disposed on the first electrode and configured to include a first emission layer, a first charge generation layer disposed on the first sub-light-emitting unit; a second sub-light-emitting unit disposed on the first charge generation layer and configured to include a second emission layer, a second charge generation layer disposed on the second sub-light-emitting unit, and a third sub-light-emitting unit disposed on the second charge generation layer and configured to include a third emission layer, wherein each of the first emission layer and the second emission layer includes a first host, the third emission layer includes a second host different from the first host, and a thickness of the second emission layer is about 1 nm or less.

In an embodiment, each of the first emission layer and the third emission layer may be a blue emission layer, and the second emission layer may be an emission layer configured to emit light that is mixed with blue light to become white light.

In an embodiment, the thickness of the second emission layer may be about 0.3 nm or more.

In an embodiment, each of a thickness of the first emission layer and a thickness of the third emission layer may be in a range of about 20 nm or more to about 30 nm or less.

In an embodiment, a thickness of the light-emitting unit may be in a range of about 100 nm or more to about 150 nm or less.

In an embodiment, an absolute value of a difference between an energy level of a highest occupied molecular orbital (HOMO) of the first emission layer and an energy level of a highest occupied molecular orbital (HOMO) of the third emission layer may be about 0.3 eV or more, and an absolute value of a difference between an energy level of a lowest unoccupied molecular orbital (LUMO) of the first emission layer and an energy level of a lowest unoccupied molecular orbital (LUMO) of the third emission layer may be about 0.15 eV or more.

In an embodiment, the absolute value of the difference between the energy level of the HOMO of the first emission layer and the energy level of the HOMO of the third emission layer may be about 1.5 eV or less.

In an embodiment, the absolute value of the difference between the energy level of the LUMO of the first emission layer and the energy level of the LUMO of the third emission layer may be about 1.0 eV or less.

In an embodiment, the second emission layer may further include a red dopant and a green dopant.

In an embodiment, each of the first emission layer and the third emission layer may further include a blue dopant, and the red dopant, the green dopant, and the blue dopant satisfy Equation 1:

$$T1_{BD} > T1_{GD} > T1_{RD}, \qquad \text{Equation 1:}$$

in Equation 1, $T1_{BD}$ is a triplet energy of the blue dopant, $T1_{GD}$ is a triplet energy of the green dopant, and $T1_{RD}$ is a triplet energy of the red dopant.

In an embodiment, the second emission layer may further include a yellow dopant.

In an embodiment, the second emission layer may include a red sub-emission layer configured to include a red dopant; and a green sub-emission layer configured to include a green dopant.

In an embodiment, the first electrode may be a reflective electrode, and the second electrode may be a transmissive electrode or a transflective electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
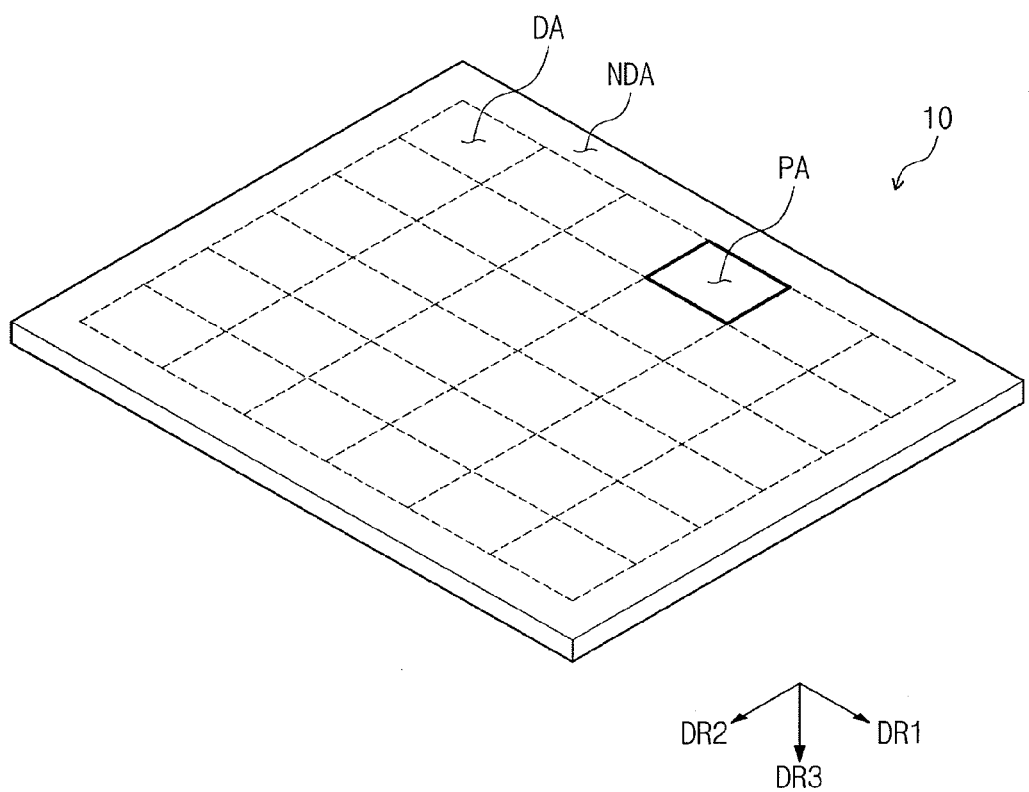
FIG. 1 illustrates a perspective view of an organic electroluminescence display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure. The terms of a singular form may include plural forms unless referred to the contrary.

It will be further understood that the terms "includes" and/or "including", when used in this specification, specify the presence of stated features, integers, steps, operations, elements, components, or combinations thereof, but do not preclude the presence or addition of one or more other features, integers, steps, operations, elements, components, or combinations thereof.

Hereinafter, an organic electroluminescence display device according to an embodiment of the present disclosure will be described.

Figure 2:
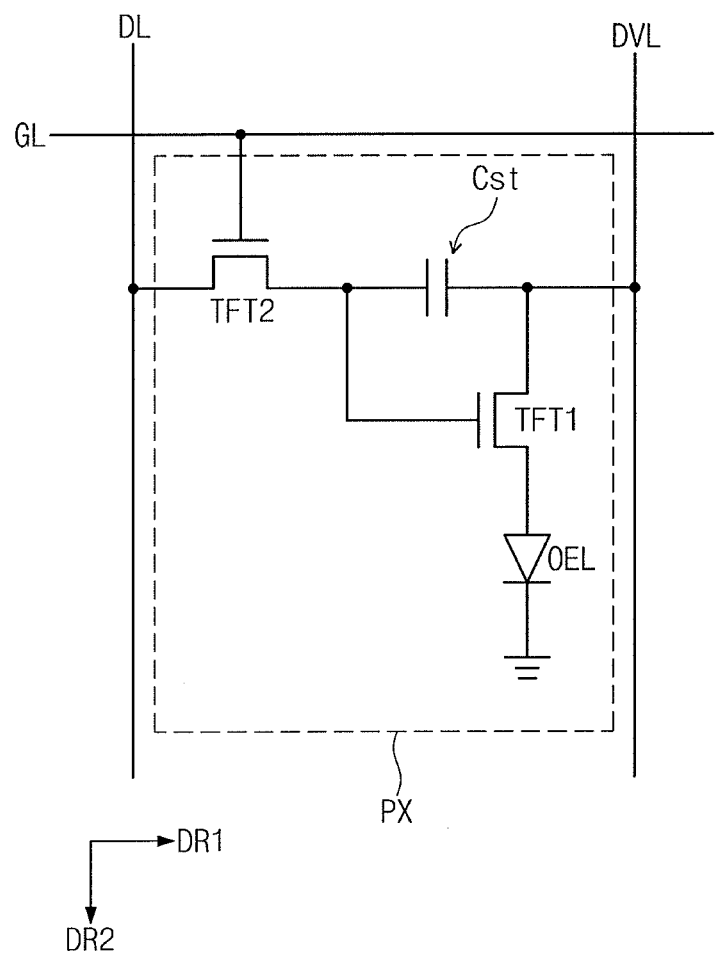
FIG. 2 illustrates a circuit diagram of a pixel in the organic electroluminescence display device according to an embodiment of the present disclosure.

FIG. 1 is a perspective view illustrating an organic electroluminescence display device according to an embodiment of the present disclosure. FIG. 2 is a circuit diagram of one of pixels included in the organic electroluminescence display device according to the embodiment of the present disclosure.

Referring to FIG. 1, an organic electroluminescence display device 10 according to an embodiment of the present disclosure is divided into a display area DA and a non-display area NDA. The display area DA displays an image. When viewed from a thickness direction (e.g., DR3) of the organic electroluminescence display device 10, the display area DA may have an approximate rectangular shape, but the embodiment of the present disclosure is not limited thereto. The display area DA is parallel to a plane defined by a first direction DR1 and a second direction DR2.

The display area DA includes a plurality of pixel areas PA. The pixel areas PA may be arranged in the form of a matrix. A plurality of pixels PX may be disposed in the pixel areas PA. Each of the pixels PX includes an organic electroluminescence device OEL (FIG. 2).

The non-display area NDA does not display an image. When viewed from the thickness direction DR3 of the organic electroluminescence display device 10, the non-display area NDA, for example, may surround the display area DA. The non-display area NDA may be adjacent to the display area DA in the first direction DR1 and the second direction DR2. The second direction DR2 crosses each of the first direction DR1 and the third direction DR3.

Referring to FIG. 2, each of the pixels PX may be connected to a wiring unit composed of a gate line GL, a data line DL, and a driving voltage line DVL. Each of the pixels PX includes thin film transistors TFT1 and TFT2 connected to the wiring unit, the organic electroluminescent device OEL connected to the thin film transistors TFT1 and TFT2, and a capacitor Cst.

The gate line GL extends in the first direction DR1. The data line DL extends in the second direction DR2 crossing the gate line GL. The driving voltage line DVL extends in substantially the same direction as the data line DL, i.e., the second direction DR2. The gate line GL transmits a scanning signal to the thin film transistors TFT1 and TFT2, the data line DL transmits a data signal to the thin film transistors TFT1 and TFT2, and the driving voltage line DVL provides a driving voltage to the thin film transistors TFT1 and TFT2.

The thin film transistors TFT1 and TFT2 may include the driving thin film transistor TFT1 for controlling the organic electroluminescent device OEL and the switching thin film transistor TFT2 configured to switch the driving thin film transistor TFT1. In an embodiment of the present disclosure, although it has been described that each of the pixels PX includes the two thin film transistors TFT1 and TFT2, the embodiment of the present disclosure is not limited thereto, and each of the pixels PX may include a single thin film transistor and a capacitor, or each of the pixels PX may include three or more thin film transistors and two or more capacitors.

Figure 3:
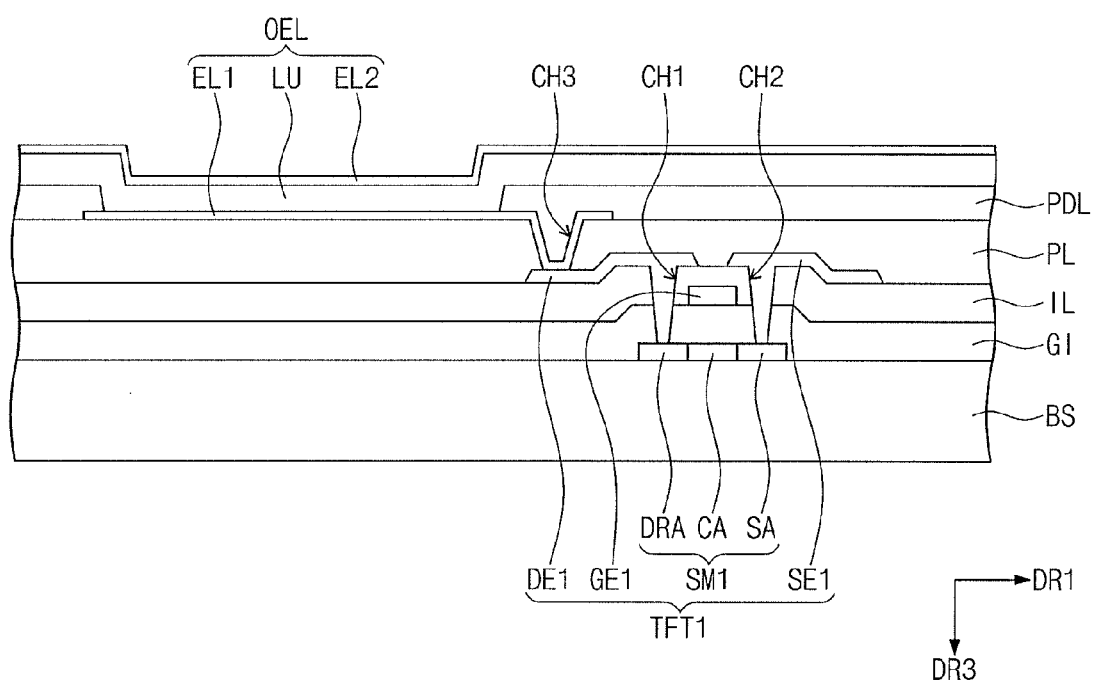
FIG. 3 illustrates a schematic cross-sectional view of a portion of a pixel in the organic electroluminescence display device according to an embodiment.

FIG. 3 is a schematic cross-sectional view illustrating a portion of the pixel PX according to embodiments. That is, FIG. 3 is a schematic cross-sectional view illustrating a portion of the pixel PX corresponding to the driving thin film transistor TFT1 and the organic electroluminescent device OEL of FIG. 2.

Referring to FIGS. 2 and 3, the driving thin film transistor TFT1 includes a first gate electrode GE1, a first source electrode SE1, and a first drain electrode DE1. The first gate electrode GE1 is connected to a first common electrode. The first source electrode SE1 is connected to the driving voltage line DVL. The first drain electrode DE1 is connected to a first electrode EL1 through a third contact hole CH3.

The capacitor Cst is connected between the first gate electrode GE1 and the first source electrode SE1 of the driving thin film transistor TFT1, and charges and maintains the data signal input from the first gate electrode GE1 of the driving thin film transistor TFT1.

The organic electroluminescence display device 10 according to the embodiment of the present disclosure may include a base substrate BS on which the driving thin film transistor TFT1 and the organic electroluminescent device OEL are stacked. The base substrate BS is not particularly limited, but, for example, may be formed of an insulating material, e.g., glass, plastic, quartz, and an organic polymer. The organic polymer in the base substrate BS may include, e.g., polyethylene terephthalate (PET), polyethylene naphthalate (PEN), polyimide, or polyethersulfone. The base substrate BS may be selected in consideration of mechanical strength, thermal stability, transparency, surface smoothness, ease of handling, or waterproofing properties. The switching thin film transistor TFT2 may be spaced apart from the driving thin film transistor TFT1 and stacked on the base substrate BS.

A substrate buffer layer may be disposed on the base substrate BS. The substrate buffer layer prevents diffusion of impurities into the driving thin film transistor TFT1 and the switching thin film transistor TFT2. The substrate buffer layer may be formed of, e.g., silicon nitride ($SiN_x$), silicon oxide ($SiO_x$), and silicon oxynitride ($SiO_xN_y$), and may be omitted depending on the material of the base substrate BS and process conditions.

A first semiconductor layer SM1 may be disposed on the base substrate BS. The first semiconductor layer SM1 is formed of a semiconductor material and operates as an active layer of the driving thin film transistor TFT1. The first semiconductor layer SM1 includes a source area SA, a drain area DRA, and a channel area CA disposed between the source area SA and the drain area DRA. The first semiconductor layer SM1 may be formed of an inorganic semiconductor or an organic semiconductor. The source area SA and the drain area DA may be doped with an n-type impurity or a p-type impurity.

A gate insulating layer GI may be disposed on the first semiconductor layer SM1. The gate insulating layer GI covers the first semiconductor layer SM1. The gate insulating layer GI may be formed of an organic insulating material or an inorganic insulating material.

The first gate electrode GE1 may be disposed on the gate insulating layer GI. The first gate electrode GE1 may be formed to cover an area corresponding to the channel area CA of the first semiconductor layer SM1.

An interlayer insulating layer IL may be disposed on the first gate electrode GE1. The interlayer insulating layer IL may cover the first gate electrode GE1. The interlayer insulating layer IL may be formed of an organic insulating material or an inorganic insulating material.

The first source electrode SE1 and the first drain electrode DEI may be disposed on the interlayer insulating layer IL. The first drain electrode DE1 may be in contact with the drain area DRA of the first semiconductor layer SM1 through a first contact hole CH1 formed in the gate insulating layer GI and the interlayer insulating layer IL, and the first source electrode SE1 may be in contact with the source area SA of the first semiconductor layer SM1 through a second contact hole CH2 formed in the gate insulating layer GI and the interlayer insulating layer IL.

A passivation layer PL may be disposed on the first source electrode SE1 and the first drain electrode DE1. The passivation layer PL may function as a protective layer configured to protect the driving thin film transistor TFT1 or may function as a planarization layer configured to planarize a top surface thereof.

The organic electroluminescent device OEL may be disposed on the passivation layer PL. The organic electroluminescent device OEL includes the first electrode EL1, a second electrode EL2 disposed on the first electrode EL1, and a light-emitting unit LU disposed between the first electrode EL1 and the second electrode EL2.

In detail, the first electrode EL1 may be disposed on the passivation layer PL, and a pixel-defining layer PDL may be disposed on the passivation layer PL and the first electrode EL1. The pixel-defining layer PDL exposes a portion of a top surface of the first electrode EL1. The pixel-defining layer PDL is not limited thereto, and may include a metal fluoride compound.

The light-emitting unit LU and the second electrode EL2 may be sequentially disposed on the pixel-defining layer PDL and the first electrode EL1. The first electrode EL1, e.g., may be a cathode. The first electrode EL1 is connected to the first drain electrode DE1 of the driving thin film transistor EL1 through the third contact hole CH3.

The first electrode EL1 has conductivity. The first electrode EL1 may be a pixel electrode or a cathode. The first electrode EL1 may be a transmissive electrode, a transflective electrode, or a reflective electrode. In a case in which the first electrode EL1 is a transmissive electrode, the first electrode EL1 may include a transparent metal oxide, e.g., indium tin oxide (ITO), indium zinc oxide (IZO), zinc oxide (ZnO), and indium tin zinc oxide (ITZO). In a case in which the first electrode EL1 is a transflective electrode or a reflective electrode, the first electrode EL1 may include, e.g., silver (Ag), magnesium (Mg), aluminum (Al), platinum (Pt), palladium (Pd), gold (Au), nickel (Ni), neodymium (Nd), iridium (Ir), chromium (Cr), or a mixture of metals.

Figure 4:
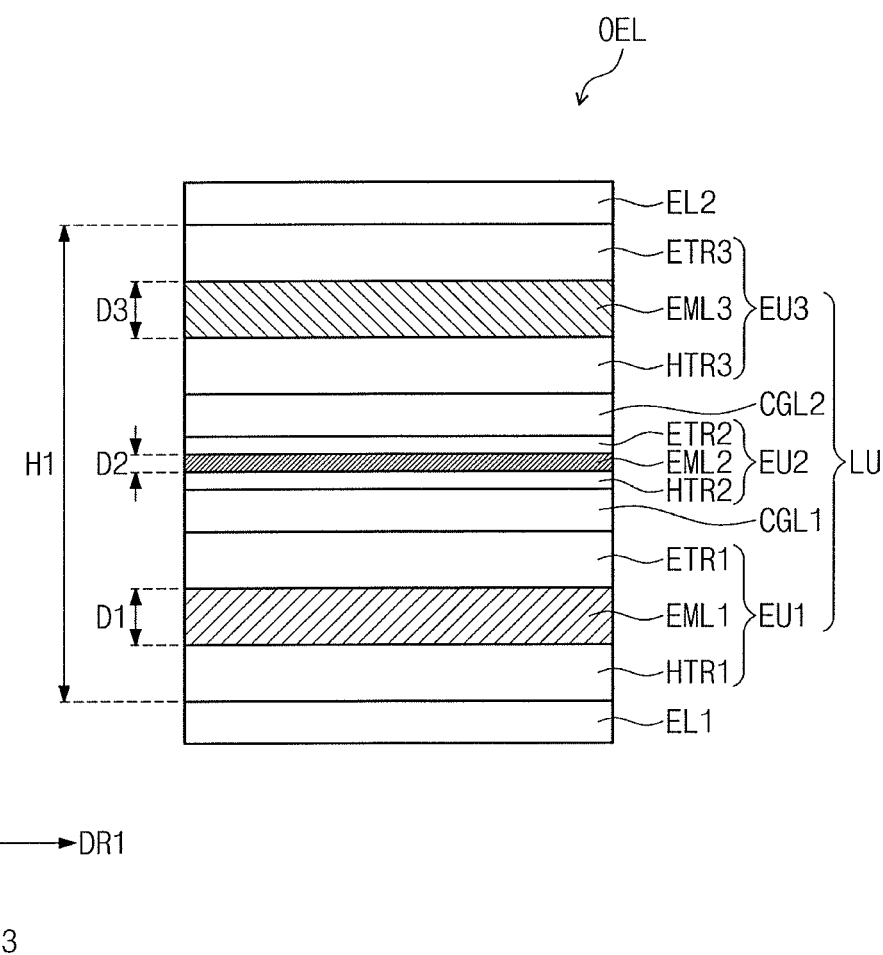
FIG. 4 illustrates a cross-sectional view of an organic electroluminescence device included in the organic electroluminescence display device according to an embodiment of the present disclosure.

FIG. 4 is a cross-sectional view illustrating the organic electroluminescence device OEL. Hereinafter, the organic electroluminescent device OEL will be described in detail with reference to FIG. 4.

The light-emitting unit LU disposed between the first electrode EL1 and the second electrode EL2 of the organic electroluminescent device OEL includes a first sub-light-emitting unit EU1, a second sub-light-emitting unit EU2, and a third sub-light-emitting unit EU3. A first charge generation layer CGL1 is disposed between the first sub-light-emitting unit EU1 and the second sub-light-emitting unit EU2. A second charge generation layer CGL2 is disposed between the second sub-light-emitting unit EU2 and the third sub-light-emitting unit EU3. That is, the first sub-light-emitting unit EU1, the first charge generation layer CGL1, the second sub-light-emitting unit EU2, the second charge generation layer CGL2, and the third sub-light-emitting unit EU3 are sequentially disposed on the first electrode EL1.

The first sub-light-emitting unit EU1 includes a first emission layer EML1, the second sub-light-emitting unit EU2 includes a second emission layer EML2, and the third sub-light-emitting unit EU3 includes a third emission layer EML3. Each of the first emission layer EML1, the second emission layer EML2, and the third emission layer EML3 includes a host as a light-emitting material.

The first emission layer EML1 and the second emission layer EML2 include the same host. That is, the first emission layer EML1 includes a first host, and the second emission layer EML2 includes the first host which is the same as that of the first emission layer EML1. The third emission layer EML3 includes a host different from that of the first emission layer EML1 and the second emission layer EML2. That is, the third emission layer EML3 includes a second host different from the first host.

Each of the first host and the second host may be any suitable hosts, as long as the first host and the second host are different from each other. For example, the first and second hosts may be tris(8-hydroxyquinolino)aluminum (Alq3), 4,4'-bis(N-carbazolyl)-1,1'-biphenyl (CBP),poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), and 2,8-bis(diphenylphosphoryl)dibenzofuran (PPF). However, the embodiment of the present disclosure is not limited thereto. For example, the first host and the second host may include any one of spiro-DPVBi, spiro-6P, distyryl-benzene (DSB), distyryl-arylene (DSA), a polyfluorene (PFO)-based polymer, and a poly(p-phenylene vinylene) (PPV)-based polymer.

Figure 5:
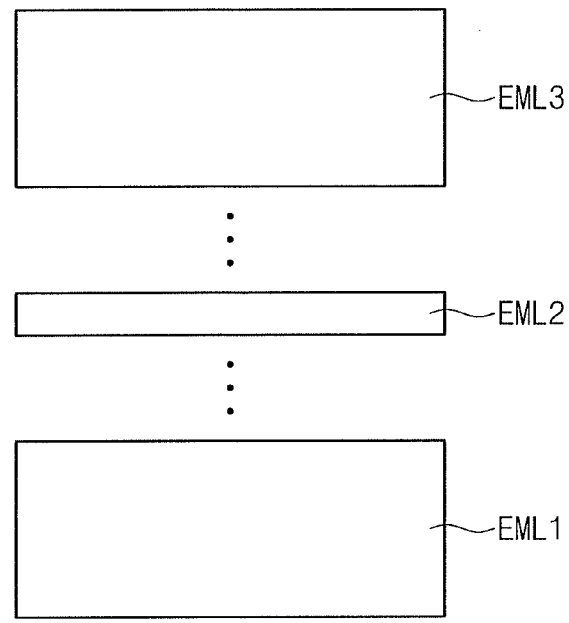
FIG. 5 illustrates a cross-sectional view of a thickness relationship between a first emission layer, a second emission layer, and a third emission layer.

FIG. 5 is a cross-sectional view illustrating a thickness relationship between the first emission layer EML1, the second emission layer EML2, and the third emission layer EML3.

Referring to FIGS. 4 and 5, the organic electroluminescent device OEL included in the organic electroluminescence display device 10 according to the embodiment of the present disclosure includes an ultra-thin emission layer in the second sub-light-emitting unit EU2. In detail, the second emission layer EML2 is the thinnest among the first emission layer EML1, the second emission layer EML2, and the third emission layer EML3. For example, a thickness D2 of the second emission layer EML2 is about 1 nm or less, e.g., the thickness D2 of the second emission layer EML2 is in a range of about 0.3 nm to about 1 nm. In a case in which the thickness D2 of the second emission layer EML2 is less than 0.3 nm, its emission function is insignificant, e.g., insufficient. In order to efficiently function as an emission layer and have a thickness of about 1 nm or less, the second emission layer EML2 may not be a blue light-emitting layer. For example, the second emission layer EML2 may be an emission layer configured to emit light that is mixed with blue light to become white light. An emission color of the second emission layer EML2 will be described later. For example, the thickness D2 of the second emission layer EML2 may be in a range of about 0.3 nm to about 0.8 nm, e.g., about 0.5 nm.

A thickness D1 of the first emission layer EML1 and a thickness D3 of the third emission layer EML3 may each independently be in a range of about 20 nm to about 30. The thickness D1 of the first emission layer EML1 and the thickness D3 of the third emission layer EML3 may be the same or may be different from each other. The thickness D1 of the first emission layer EML1, e.g., may be in a range of about 24 nm to about 30 nm. The thickness D3 of the third emission layer EML3, e.g., may be in a range of about 24 nm to about 30 nm.

The thickness D1 of the first emission layer EML1 may be about 20 times or more greater than the thickness D2 of the second emission layer EML2, e.g., the thickness D1 of the first emission layer EML1 may be about 24 times to about 30 times the thickness D2 of the second emission layer EML2. The thickness D3 of the third emission layer EML3 may be about 20 times or more greater than the thickness D2 of the second emission layer EML2, e.g., the thickness D3 of the third emission layer EML3 may be about 24 times to about 30 times the thickness D2 of the second emission layer EML2.

Since the organic electroluminescence display device 10 according to the embodiment of the present disclosure includes the second sub-light-emitting unit EU2 that includes the ultra-thin emission layer (second emission layer EML2), material costs may be reduced, e.g., in comparison to an organic electroluminescence display device having a thicker emission layer. That is, since the thickness D2 of the second emission layer EML2 is about 1 nm or less, an amount of material for forming the second emission layer EML2 may be reduced, thereby reducing the overall material costs. Also, since the second emission layer EML2 is an ultra-thin emission layer, it may be advantageous to secure the process conditions.

In addition, since the organic electroluminescence display device 10 according to the embodiment of the present disclosure includes the second sub-light-emitting unit EU2 that includes the ultra-thin emission layer (second emission layer EML2), the overall thickness of the organic electroluminescence display device 10 may be reduced, thereby complying with a thinning trend of display devices. For example, a thickness Hi of the light-emitting unit LU may be in a range of about 100 nm to about 150 nm. The thickness H1 of the light-emitting unit LU may refer to a spacing between, e.g., facing surfaces of, the first electrode EL1 and the second electrode EL2. The thickness H1 of the light-emitting unit LU may denote a total sum of each thickness of layers included in the light-emitting unit LU.

Further, since the second sub-light-emitting unit EU2 is disposed to be spaced apart from each of the first electrode EL1 and the second electrode EL2, a hole or electron injection amount becomes smaller than those of the first sub-light-emitting unit EU1 and the third sub-light-emitting unit EU3. The second sub-light-emitting unit EU2 receives holes and electrons respectively from the first charge generation layer CGL1 and the second charge generation layer CGL2 to be described later in detail, but the hole or electron injection amount may be relatively smaller than those of the first sub-light-emitting unit EU1 and the third sub-light-emitting unit EU3 which are respectively adjacent to the first electrode EL1 and the second electrode EL2.

Since the organic electroluminescence display device 10 according to the embodiment of the present disclosure is formed to allow the second emission layer EML2 included in the second sub-light-emitting unit EU2 to include the same host as that of the first emission layer EML1 included in the first sub-light-emitting unit EU1, holes may be more easily injected thereinto. Thus, the organic electroluminescence display device 10 according to the embodiment of the present disclosure may reduce material costs without a reduction in efficiency.

Figure 6:
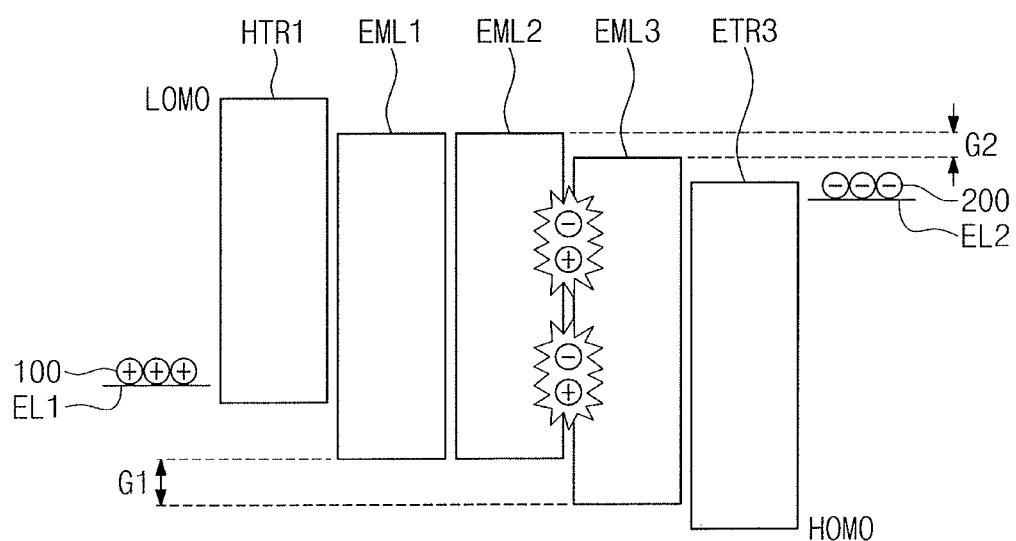
FIG. 6 illustrates a schematic energy band diagram of a light-emitting unit included in the organic electroluminescence display device according to an embodiment of the present disclosure.

FIG. 6 is a schematic energy band diagram of the light-emitting unit LU. In FIG. 6, some constituent elements are omitted for convenience of explanation.

Referring to FIG. 6, the first emission layer EML1 and the third emission layer EML3 may have a highest occupied molecular orbital (HOMO) energy level difference above a certain level and a lowest unoccupied molecular orbital (LUMO) energy level difference above a certain level.

In detail, an absolute value of a difference G1 between an energy level of highest occupied molecular orbital (HOMO) of the first emission layer EML1 and an energy level of highest occupied molecular orbital (HOMO) of the third emission layer EML3 may be about 0.3 eV or more, and an absolute value of a difference G2 between an energy level of lowest unoccupied molecular orbital (LUMO) of the first emission layer EML1 and an energy level of lowest unoccupied molecular orbital (LUMO) of the third emission layer EML3 may be about 0.15 eV or more. In general, since mobility of holes 100 is greater than mobility of electrons 200, a charge balance in the second emission layer EML2 may be increased by relatively increasing the energy level difference of the HOMO as a movement path of the holes 100 and relatively decreasing the energy level difference of the LUMO as a movement path of the electrons 200.

Also, when the above condition is satisfied, an emission zone of the second emission layer EML2 may be formed to be inclined to a second electrode direction (e.g., interface between the second emission layer EML2 and the third emission layer EML3) in the second emission layer EML2. In the present specification, the expression "emission zone" denotes a region in which the holes 100 and the electrons 200 are mainly combined in the emission layer. That is, while the holes 100 and the electrons 200 may meet and be combined over the entire emission layer, the emission zone denotes a region in which excitons formed by combination of the holes 100 and the electrons 200 are densely populated.

Specifically, since the second emission layer EML2 may more easily receive holes by including the same first host as that of the first emission layer EML1 and may have a small thickness of about 1 nm or less, the holes injected into the second emission layer EML2 may move in the direction of the second electrode EL2 at a relatively fast rate in the second emission layer EML2. In a case in which an energy gap between the second emission layer EML2 and the third emission layer EML3 satisfies the above condition, since a ratio, in which the holes 100 move in a direction of the third emission layer EML3, is reduced, the emission zone in the second emission layer EML2 is allowed to be formed at the interface between the second emission layer EML2 and the third emission layer EML3.

In a case in which the absolute value of the difference G1 between the energy level of the highest occupied molecular orbital (HOMO) of the first emission layer EML1 and the energy level of the highest occupied molecular orbital (HOMO) of the third emission layer EML3 is less than about 0.3 eV, an effect of the difference G1 as an energy barrier for the holes 100 is insignificant, and an amount of the holes moved in the direction of the second electrode EL2 by passing through the second emission layer EML2 may be increased. Also, in a case in which the absolute value of the difference G2 between the energy level of the lowest unoccupied molecular orbital (LUMO) of the first emission layer EML1 and the energy level of the lowest unoccupied molecular orbital (LUMO) of the third emission layer EML3 is less than about 0.15 eV, since an energy barrier for the electrons 200 with respect to the energy barrier for the holes 100 is excessively low, the injection of the electrons 200 into the second emission layer EML2 becomes unnecessarily easy, and thus, the charge balance in the second emission layer EML2 may be decreased.

The absolute value of the difference G1 between the energy level of the highest occupied molecular orbital (HOMO) of the first emission layer EML1 and the energy level of the highest occupied molecular orbital (HOMO) of the third emission layer EML3 may be in a range of about 0.3 eV to about 1.5 eV. Even in a case in which the absolute value of the difference G1 between the energy level of the highest occupied molecular orbital (HOMO) of the first emission layer EML1 and the energy level of the highest occupied molecular orbital (HOMO) of the third emission layer EML3 is about 1.5 eV or less, the difference G1 may sufficiently act as the energy barrier for the holes 100, and thus, the absolute value of the difference G1 between the energy level of the highest occupied molecular orbital (HOMO) of the first emission layer EML1 and the energy level of the highest occupied molecular orbital (HOMO) of the third emission layer EML3 may be about 1.5 eV or less in consideration of ease of material selection. For example, the energy level of the highest occupied molecular orbital (HOMO) of the first emission layer EML1 may be about 0.3 eV or more higher than the energy level of the highest occupied molecular orbital (HOMO) of the third emission layer EML3.

The absolute value of the difference G2 between the energy level of the lowest unoccupied molecular orbital (LUMO) of the first emission layer EML1 and the energy level of the lowest unoccupied molecular orbital (LUMO) of the third emission layer EML3 may be in a range of about 0.15 eV to about 1.0 eV. In a case in which the absolute value of the difference G2 between the energy level of the lowest unoccupied molecular orbital (LUMO) of the first emission layer EML1 and the energy level of the lowest unoccupied molecular orbital (LUMO) of the third emission layer EML3 is greater than about 1.0 eV, since the energy barrier for the electrons 200 may increase, the charge balance in the second emission layer EML2 may be decreased. For example, the energy level of the lowest unoccupied molecular orbital (LUMO) of the first emission layer EML1 may be about 0.15 eV or more higher than the energy level of the lowest unoccupied molecular orbital (LUMO) of the third emission layer EML3.

Since the second emission layer EML2 includes the first host, i.e., the same host as that of the first emission layer EML1, the second emission layer EML2 has an energy level that is the same as/similar to that of the first emission layer EML1. Thus, an absolute value of an energy level difference between the second emission layer EML2 and the third emission layer EML3 may be the same as the above-described absolute value of the energy level difference between the first emission layer EML1 and the third emission layer EML3. In detail, an absolute value of a difference between an energy level of highest occupied molecular orbital (HOMO) of the second emission layer EML2 and the energy level of the highest occupied molecular orbital (HOMO) of the third emission layer EML3 may be about 0.3 eV or more, e.g., may be in a range of about 0.3 eV to about 1.5 eV. Also, an absolute value of a difference between an energy level of lowest unoccupied molecular orbital (LUMO) of the second emission layer EML2 and the energy level of the lowest unoccupied molecular orbital (LUMO) of the third emission layer EML3 may be about 0.15 eV or more, e.g., may be in a range of about 0.15 eV to about 1.0 eV. An effect obtained when the value satisfies the above range is the same as described above.

Referring again to FIG. 4, the first sub-light-emitting unit EU1 may further include an additional component if necessary. For example, the first sub-light-emitting unit EU1 may further include a first hole transport region HTR1 disposed between the first electrode EL1 and the first emission layer EML1. The first sub-light-emitting unit EU1 may further include a first electron transport region ETR1 disposed between the first emission layer EML1 and the first charge generation layer CGL1.

The second sub-light-emitting unit EU2 may further include an additional component if necessary. For example, the second sub-light-emitting unit EU2 may further include a second hole transport region HTR2 disposed between the first charge generation layer CGL1 and the second emission layer EML2. The second sub-light-emitting unit EU2 may further include a second electron transport region ETR2 disposed between the second emission layer EML2 and the second charge generation layer CGL2.

The third sub-light-emitting unit EU3 may further include an additional component if necessary. For example, the third sub-light-emitting unit EU3 may further include a third hole transport region HTR3 disposed between the second charge generation layer CGL2 and the third emission layer EML3. The third sub-light-emitting unit EU3 may further include a third electron transport region ETR3 disposed between the third emission layer EML3 and the second electrode EL2.

Any suitable hole transport region may be employed as each of the first hole transport region HTR1, the second hole transport region HTR2, and the third hole transport region HTR3. For example, each of the first hole transport region HTR1, the second hole transport region HTR2, and the third hole transport region HTR3 may have a structure of single layers formed of a plurality of different materials or may have a structure of hole injection layer/hole transport layer, hole injection layer/hole transport layer/hole buffer layer, hole injection layer/hole buffer layer, hole transport layer/hole buffer layer, or hole injection layer/hole transport layer/electron blocking layer which are sequentially stacked from the first electrode EL1, but the embodiment of the present disclosure is not limited thereto.

Each of the first hole transport region HTR1, the second hole transport region HTR2, and the third hole transport region HTR3 may be formed by any suitable method. For example, the first hole transport region HTR1 may be formed by using various methods, e.g., a vacuum deposition method, a spin coating method, a casting method, a Langmuir-Blodgett (LB) method, an inkjet printing method, a laser printing method, and a laser induced thermal imaging (LITI) method. The first hole transport region HTR1, the second hole transport region HTR2, and the third hole transport region HTR3 may be the same or may be different from one another.

The hole injection layer may include a phthalocyanine compound, e.g., copper phthalocyanine; N,N'-diphenyl-N,N-bis-[4-(phenyl-m-tolyl-amino)-phenyl]-biphenyl-4,4'-diamine (DNTPD), 4,4',4"-tris(3-methylphenyl phenylamino) triphenylamine (m-MTDATA), 4,4',4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS), but the embodiment of the present disclosure is not limited thereto.

The hole transport layer may include a carbazole-based derivative, e.g., N-phenyl carbazole and polyvinyl carbazole, a fluorine-based derivative, a triphenylamine-based derivative, e.g., N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N-di(1-naphthyl)-N,N'-diphenylbenzidine (NPB), or 4,4'-cyclohexylidene bis[N,N-bis(4-methylphenyl)benzenamine](TAPC), but the embodiment of the present disclosure is not limited thereto.

In addition to the above-described materials, each of the first hole transport region HTR1, the second hole transport region HTR2, and the third hole transport region HTR3 may further include a charge generating material for improving conductivity. The charge generating material may be uniformly or non-uniformly dispersed in the first hole transport region HTR1. The charge generating material, e.g., may be a p-type dopant. The p-type dopant may be one of, e.g., a quinone derivative, a metal oxide, and a cyano group-containing compound, but the embodiment of the present disclosure is not limited thereto. For example, non-limiting examples of the p-type dopant may include a quinone derivative, e.g., tetracyanoquinodimethane (TCNQ) and 2,3,5,6-tetrafluoro-tetracyanoquinodimethane (F4-TCNQ), and a metal oxide, e.g., tungsten oxide and molybdenum oxide, but the embodiment of the present disclosure is not limited thereto.

Any electron transport region commonly known in the art may be employed as each of the first electron transport region ETR1, the second electron transport region ETR2, and the third electron transport region ETR3. For example, each of the first electron transport region ETR1, the second electron transport region ETR2, and the third electron transport region ETR3 may include at least one of a hole blocking layer, an electron transport layer, and an electron injection layer, but the embodiment of the present disclosure is not limited thereto.

Each of the first electron transport region ETR1, the second electron transport region ETR2, and the third electron transport region ETR3 may be formed by using various methods, e.g., a vacuum deposition method, a spin coating method, a casting method, a Langmuir-Blodgett (LB) method, an inkjet printing method, a laser printing method, and a laser induced thermal imaging (LITI) method. The first electron transport region ETR1, the second electron transport region ETR2, and the third electron transport region ETR3 may be the same or may be different from one another.

The electron transport layer may include, e.g., tris(8-hydroxyquinolinato)aluminum ($Alq_3$), 1,3,5-tri(1-phenyl-1H-benzo [d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), and a mixture thereof, but the embodiment of the present disclosure is not limited thereto.

For example, LiF, lithium quinolate (LiQ), $Li_2O$, BaO, NaCl, CsF, a lanthanide metal, e.g., ytterbium (Yb), or a metal halide, e.g., RbCl and RbI, may be used in the electron injection layer, but the embodiment of the present disclosure is not limited thereto. The electron injection layer may also be formed of a material in which an electron transport material and an insulating organometallic salt are mixed. The organometallic salt may be a material having an energy band gap of about 4 eV or more. Specific examples of the organometallic salt may be metal acetate, metal benzoate, metal acetoacetate, metal acetylacetonate, or metal stearate.

Any suitable charge generation layer may be employed as each of the first charge generation layer CGL1 and the second charge generation layer CGL2. For example, each of the first charge generation layer CGL1 and the second charge generation layer CGL2 may have a structure in which an n-type charge generation layer and a p-type charge generation layer are bonded to each other. However, the embodiment of the present disclosure is not limited thereto. The first charge generation layer CGL1 may adjust a charge balance between the first sub-light-emitting unit EU1 and the second sub-light-emitting unit EU2 by injecting electrons into the first emission layer EML1 and injecting holes into the second emission layer EML2. The second charge generation layer CGL2 may adjust a charge balance between the second sub-light-emitting unit EU2 and the third sub-light-emitting unit EU3 by injecting electrons into the second emission layer EML2 and injecting holes into the third emission layer EML3.

The second electrode EL2 may be a common electrode or an anode. The second electrode EL2 may be a transmissive electrode, a transflective electrode, or a reflective electrode.

In a case in which the second electrode EL2 is a transmissive electrode, the second electrode EL2 may include, e.g., lithium (Li), calcium (Ca), LiF/Ca, LiF/Al, Al, Mg, BaF, barium (Ba), Ag, or a compound or mixture thereof (e.g., mixture of Ag and Mg). However, the embodiment of the present disclosure is not limited thereto, and the second electrode EL2 may include, e.g., indium tin oxide (ITO), indium zinc oxide (IZO), zinc oxide (ZnO), or indium tin zinc oxide (ITZO).

Although not shown in the drawings, the second electrode EL2 may be connected to an auxiliary electrode. Any suitable material may be used as the auxiliary electrode without limitations. For example, the auxiliary electrode may include Li, Ca, LiF/Ca, LiF/Al, Al, Mg, BaF, Ba, Ag, or a compound or mixture thereof (e.g., mixture of Ag and Mg). However, the embodiment of the present disclosure is not limited thereto, and the auxiliary electrode may also include, e.g., ITO, IZO, ZnO, or ITZO. For example, the auxiliary electrode may be connected to the second electrode EL2 to reduce a resistance value of the second electrode EL2.

In a case in which the second electrode EL2 is a transflective electrode or a reflective electrode, the second electrode EL2 may include, e.g., Ag, Mg, Al, Pt, Pd, Au, Ni, Nd, Ir, Cr, Li, Ca, LiF/Ca, LiF/Al, Mo, Ti, or a compound or mixture thereof (e.g., mixture of Ag and Mg). Alternatively, the second electrode EL2 may have a multilayer structure including a reflective layer or a transflective layer formed of the above materials and a transparent conductive layer formed of, e.g., ITO, IZO, ZnO, or ITZO.

The first electrode EL1 may be a reflective electrode, and the second electrode EL2 may be a transmissive electrode or a transflective electrode. That is, the organic electroluminescent device OEL included in the organic electroluminescence display device 10 according to the embodiment of the present disclosure may be a top emission type.

The organic electroluminescence display device 10 according to the embodiment of the present disclosure may include two blue light-emitting units and one light-emitting unit configured to emit a color that is mixed with blue light to become white light. For example, each of the first sub-light-emitting unit EU1 and the third sub-light-emitting unit EU3 may be a blue light-emitting unit. For example, each of the first emission layer EML1 and the third emission layer EML3 is a blue emission layer, and the second emission layer EML2 may be an emission layer configured to emit a color that is mixed with blue light to become white light.

The expression "blue emission layer" denotes an emission layer configured to emit light corresponding to a blue wavelength range. For example, each of the first emission layer EML1 and the third emission layer EML3 may emit light having a wavelength of about 490 nm or less or about 480 nm or less. For example, the first emission layer EML1 emits first blue light, the third emission layer EML3 emits second blue light, and the first blue light and the second blue light may have the same wavelength range or may have partially different wavelength ranges. For example, one of the first blue light and the second blue light may have a wavelength range of about 440 nm to about 460 nm, and the other one may have a wavelength range of about 460 nm to about 480 nm. However, the embodiment of the present disclosure is not limited thereto.

Hereinafter, the second emission layer EML2 will be described in more detail with reference to FIGS. 7 through 9.

Figure 7:
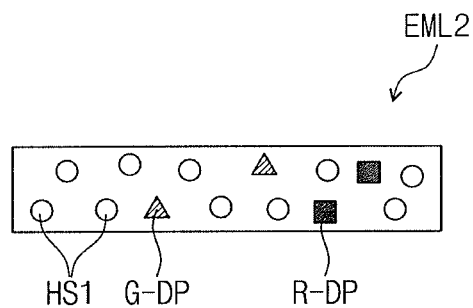
FIG. 7 illustrates a schematic view of a host and dopants included in the second emission layer.

For example, referring to FIG. 7, the second emission layer EML2 may have a single-layered structure. In the single-layered structure, the second emission layer EML2 may further include a red dopant R-DP and a green dopant G-DP in addition to a first host HS1.

Figure 8:
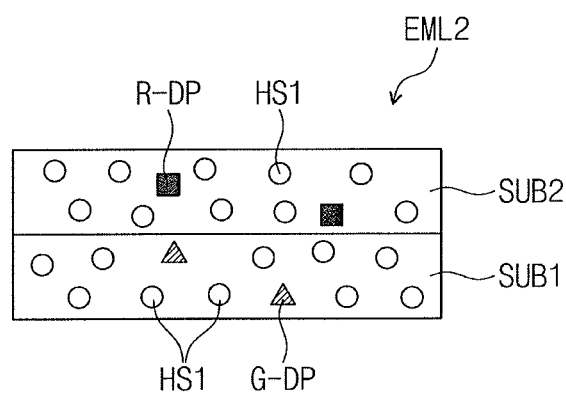
FIG. 8 illustrates a schematic view of the host and the dopants in the second emission layer.

In another example, referring to FIG. 8, the second emission layer EML2 may have a multi-layered structure. For example, the second emission layer EML2 may include a green sub-emission layer SUB1 and a red sub-emission layer SUB2. In FIG. 8, that the green sub-emission layer SUB1 and the red sub-emission layer SUB2 are in contact with each other is illustrated as an example, but the embodiment of the present disclosure is not limited thereto. For example, a buffer layer may be disposed between the green sub-emission layer SUB1 and the red sub-emission layer SUB2 if necessary.

The green sub-emission layer SUB1 among the green sub-emission layer SUB1 and the red sub-emission layer SUB2 may be disposed more adjacent to the first charge generation layer CGL1 or the red sub-emission layer SUB2 may be disposed more adjacent to the first charge generation layer CGL1. The green sub-emission layer SUB1 may include the first host HS1 and the green dopant G-DP, and the red sub-emission layer SUB2 may include the first host HS1 and the red dopant R-DP.

Referring to FIGS. 4 and 7, each of the first emission layer EML1 and the third emission layer EML3 may further include a blue dopant. The blue dopant of the first emission layer EML1 and the third emission layer EML3 and the green dopant G-DP and the red dopant R-DP of the second emission layer EML2 may satisfy the following Equation 1.

$$T1_{BD} > T1_{GD} > T1_{RD} \qquad \text{Equation 1:}$$

In Equation 1, $T1_{BD}$ is a triplet energy of the blue dopant, $T1_{GD}$ is a triplet energy of the green dopant G-DP, and $T1_{RD}$ is a triplet energy of the red dopant R-DP.

In a case in which the blue dopant of the first emission layer EML1 and the third emission layer EML3 and the green dopant G-DP and the red dopant R-DP of the second emission layer EML2 satisfy Equation 1, red emission efficiency may be improved. With respect to red emission, since red light generated when the blue dopant drops from a triplet excited state to a ground state through a triplet excited state of the green dopant G-DP and red light generated when the green dopant G-DP drops from a triplet excited state to a ground state are added to red light generated when the red dopant R-DP drops from a triplet excited state to a ground state, the red emission efficiency may be maximized.

If a condition is satisfied in which the blue dopant included in the first emission layer EML1 and the blue dopant included in the third emission layer EML3 have a triplet energy level higher than those of the green dopant G-DP and the red dopant R-DP included in the second emission layer EML2, the blue dopant included in the first emission layer EML1 and the blue dopant included in the third emission layer EML3 may be the same or may be different from each other if necessary.

Any suitable red dopant may be used as the red dopant R-DP. For example, the red dopant R-DP may be a metal complex or organometallic complex, e.g., bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP). However, the embodiment of the present disclosure is not limited thereto.

Any suitable green dopant may be used as the green dopant G-DP. For example, the green dopant G-DP may be a metal complex or organometallic complex, e.g., fac-tris (2-phenylpyridine)iridium (Ir(ppy)3), but the embodiment of the present disclosure is not limited thereto.

Any suitable blue dopant may be used as the blue dopant. For example, the blue dopant may be a metal complex or organometallic complex, e.g., $(4,6-F2ppy)_2Irpic$, but the embodiment of the present disclosure is not limited thereto.

Figure 9:
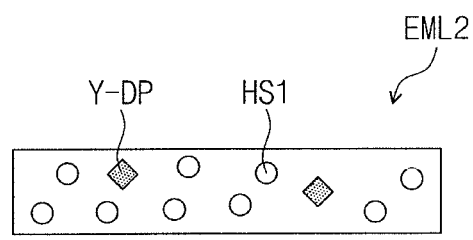
FIG. 9 illustrates a schematic view of the host and dopants in the second emission layer.

In another example, referring to FIG. 9, the second emission layer EML2 may further include a yellow dopant Y-DP in addition to the first host HS1. The second emission layer EML2 may be a yellow emission layer. In this case, the second sub-light-emitting unit EU2 may be a yellow unit.

In a case in which the second emission layer EML2 includes the yellow dopant Y-DP, a triplet energy of the yellow dopant Y-DP may have an energy level lower than that of the triplet energy of each of the blue dopant included in the first emission layer EML1 and the blue dopant included in the third emission layer EML3. When the above condition is satisfied, emission efficiency of yellow light may be increased.

By way of summation and review, the present disclosure provides an organic electroluminescence display device in which material cost may be reduced and process conditions may be easily secured. The present disclosure also provides a highly efficient organic electroluminescence display device.

That is, according to the embodiment of the present disclosure, the organic electroluminescence display device may exhibit excellent efficiency while reducing material costs. Also, since the organic electroluminescence display device according to the embodiment of the present disclosure includes the ultra-thin emission layer, the thickness of the entire display device may be reduced, and thus, the organic electroluminescence display device according to the embodiment of the present disclosure may comply with a thinning trend of display devices. Further, according to the organic electroluminescence display device according to the embodiment of the present disclosure, process conditions may be easily secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence display device, comprising:
   a first electrode;
   a second electrode on the first electrode; and
   a light-emitting unit between the first electrode and the second electrode, the light-emitting unit including:
   a first sub-light-emitting unit on the first electrode and including a first emission layer,
   a first charge generation layer on the first sub-light-emitting unit,
   a second sub-light-emitting unit on the first charge generation layer and including a second emission layer,
   a second charge generation layer on the second sub-light-emitting unit, and
   a third sub-light-emitting unit on the second charge generation layer and including a third emission layer,
   wherein each of the first emission layer and the second emission layer includes a first host, the third emission layer includes a second host different from the first host, and a thickness of the second emission layer is 0.3 nm to 1.0 nm.

2. The organic electroluminescence display device as claimed in claim 1, wherein each of the first emission layer and the third emission layer is a blue emission layer, and the second emission layer is an emission layer to emit light that is mixed with blue light to become white light.

3. The organic electroluminescence display device as claimed in claim 1, wherein each of a thickness of the first emission layer and a thickness of the third emission layer is in a range of 20 nm to 30 nm.

4. The organic electroluminescence display device as claimed in claim 1, wherein a thickness of the light-emitting unit is in a range of 100 nm to 150 nm.

5. The organic electroluminescence display device as claimed in claim 1, wherein:
   an absolute value of a difference between an energy level of a highest occupied molecular orbital (HOMO) of the first emission layer and an energy level of a highest occupied molecular orbital (HOMO) of the third emission layer is 0.3 eV to 1.5 eV, and
   an absolute value of a difference between an energy level of a lowest unoccupied molecular orbital (LUMO) of the first emission layer and an energy level of a lowest unoccupied molecular orbital (LUMO) of the third emission layer is 0.15 eV to 1.0 eV.

6. The organic electroluminescence display device as claimed in claim 2, wherein the second emission layer further includes a red dopant and a green dopant.

7. The organic electroluminescence display device as claimed in claim 6, wherein:
   each of the first emission layer and the third emission layer further includes a blue dopant,
   the red dopant, the green dopant, and the blue dopant satisfy Equation 1 below, $T1_{BD} > T1_{GD} > T1_{RD}$, and     Equation 1 in Equation 1, $T1_{BD}$ is a triplet energy of the blue dopant, $T1_{GD}$ is a triplet energy of the green dopant, and $T1_{RD}$ is a triplet energy of the red dopant.

8. The organic electroluminescence display device as claimed in claim 2, wherein the second emission layer further includes a yellow dopant.

9. The organic electroluminescence display device as claimed in claim 2, wherein the second emission layer includes:
   a red sub-emission layer including a red dopant; and
   a green sub-emission layer including a green dopant.

10. The organic electroluminescence display device as claimed in claim 1, wherein the first electrode is a reflective electrode, and the second electrode is a transmissive electrode or a transflective electrode.

* * * * *